(12) United States Patent
Petrenko et al.

(10) Patent No.: US 8,299,684 B2
(45) Date of Patent: Oct. 30, 2012

(54) PIEZOELECTRIC QUASI-RESONANCE LINEAR MOTORS BASED ON ACOUSTIC STANDING WAVES WITH COMBINED RESONATOR

(75) Inventors: Serhiy Petrenko, Kiev (UA); Valentin Rangelov Zhelyaskov, Sarasota, FL (US)

(73) Assignee: Discovery Technology International, Inc., Sarasota, FL (US)

( * ) Notice: Subject to any disclaimer, the term of this patent is extended or adjusted under 35 U.S.C. 154(b) by 447 days.

(21) Appl. No.: 12/642,329

(22) Filed: Dec. 18, 2009

(65) Prior Publication Data

US 2010/0156239 A1      Jun. 24, 2010

Related U.S. Application Data

(60) Provisional application No. 61/138,665, filed on Dec. 18, 2008, provisional application No. 61/178,323, filed on May 14, 2009.

(51) Int. Cl.
*H01L 41/08*      (2006.01)
*H02N 2/04*      (2006.01)
(52) U.S. Cl. .............................. 310/323.16; 310/323.02
(58) Field of Classification Search ........................ None
See application file for complete search history.

(56) References Cited

U.S. PATENT DOCUMENTS

| 5,682,076 | A |   | 10/1997 | Zumeris |
|---|---|---|---|---|
| 5,850,117 | A | * | 12/1998 | Tobe et al. ................... 310/312 |
| 5,933,554 | A | * | 8/1999 | Leuthold et al. ............... 385/28 |
| 2006/0175930 | A1 |   | 8/2006 | Ganor et al. |
| 2008/0284284 | A1 |   | 11/2008 | Kawada et al. |

FOREIGN PATENT DOCUMENTS

JP      2005-168137 A      6/2005

* cited by examiner

*Primary Examiner* — J. San Martin
(74) *Attorney, Agent, or Firm* — Fox Rothschild LLP; Robert J. Sacco

(57) ABSTRACT

A piezoelectric device includes a piezoresonator body (3) having opposing first and second surfaces and opposing third and fourth surfaces. The device also includes at least one common electrode (8) disposed on the second surface (15) and electrodes (4a, 4b) disposed on the first surface (14) in pairs along a first longitudinal axis. The device further includes contact elements (5) disposed on the third (16) and the fourth (17) surfaces at contact locations along the first longitudinal axis and aligned between each pair of excitation electrodes. In the device, the piezoelectric body has a first order natural resonance frequency ($v_1$) along a second longitudinal axis and an even order natural resonance frequency ($v_2$) along the first longitudinal axis, where a percent difference between $v_1$ and $v_2$ is greater than 0% and less than or equal to 20%.

23 Claims, 10 Drawing Sheets

100

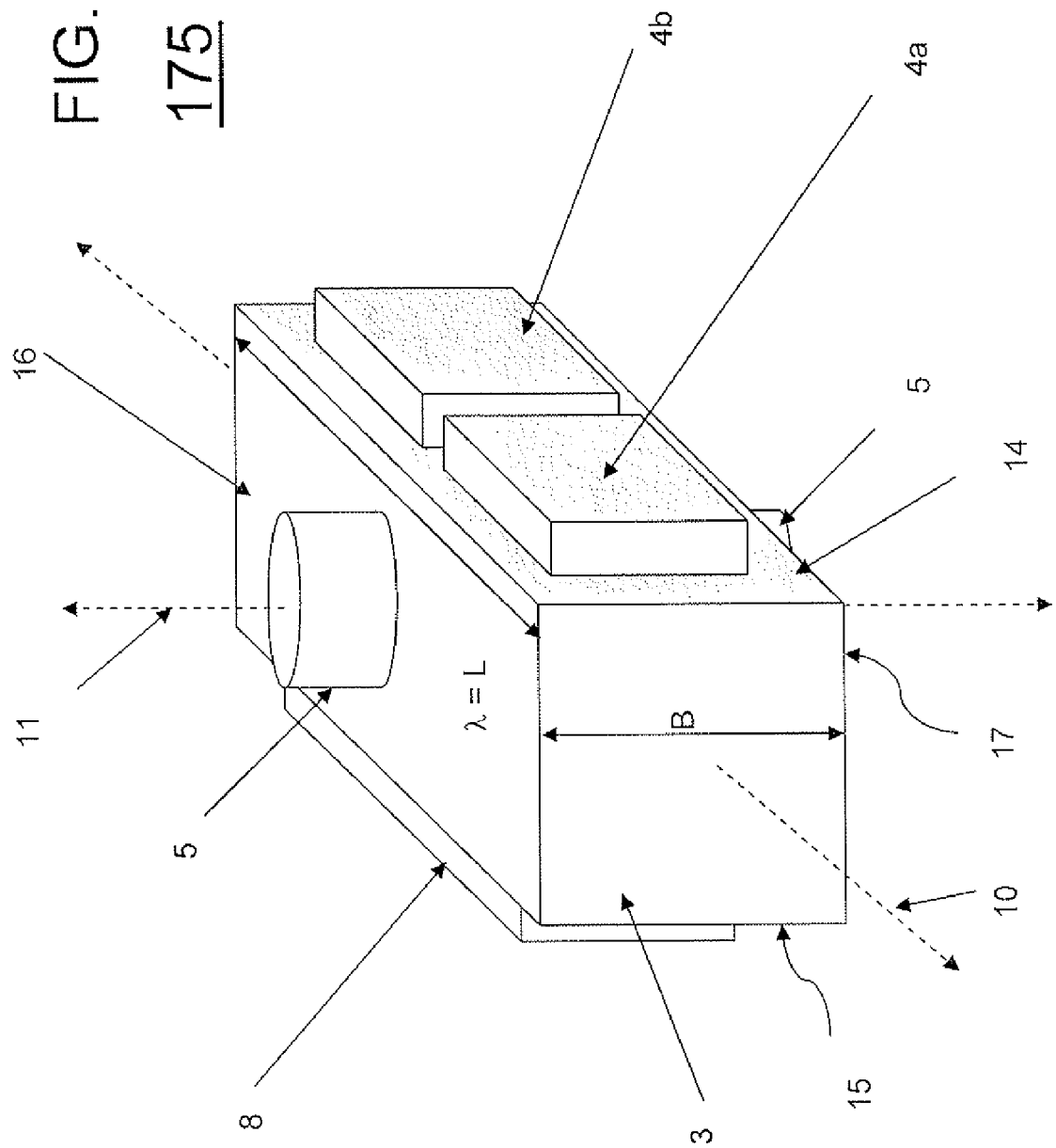

600

700

800

850

850

US 8,299,684 B2

PIEZOELECTRIC QUASI-RESONANCE LINEAR MOTORS BASED ON ACOUSTIC STANDING WAVES WITH COMBINED RESONATOR

CROSS REFERENCE TO RELATED APPLICATIONS

This application is a non-provisional patent application claiming the benefit of U.S. Patent application Ser. No. 61/138,665 filed on Dec. 18, 2008, and U.S. Patent application Ser. No. 61/178,323 filed on May 14, 2009, the entireties which are incorporated herein by reference.

FIELD OF THE INVENTION

The invention relates to piezoelectric motors, and more particularly to piezoelectric quasi-resonance motors based on standing acoustic waves and a combined resonator.

BACKGROUND OF THE INVENTION

In general, piezoelectric actuators are formed from a flat piezoelectric element, which is typically configured to have a specific ratio between the length and the width of the piezoelectric element (the resonator length (L) and width (B) are related by the equation B=0.5L). This configuration generally enables a plane longitudinal elastic 2-D wave to be excited in the piezoelectric element. The result is generally the linear displacement of the contact point, which is typically located in the center of the resonator and is coupled to the rest of the motor using a contact or friction element attached to the surface of the piezoelectric element.

SUMMARY

Embodiments of the invention concern piezoelectric motors and systems therefrom. In a first embodiment of the invention, a piezoelectric device is provided. The device includes a piezoresonator body having opposing first and second surfaces and opposing third and fourth surfaces, the first and the second surfaces being substantially parallel to first and second longitudinal axes of the piezoresonator body, the third and the fourth surfaces being substantially parallel to the first longitudinal axis and substantially perpendicular to the second longitudinal axis, and the first and the second longitudinal axes being substantially perpendicular to each other. The device also includes at least one common electrode disposed on the second surface and a plurality of electrodes disposed on the first surface, the plurality of electrodes includes one or more pairs of excitation electrodes, each of the pairs of excitation electrodes includes a first electrode and a second electrode positioned along a first direction along the first longitudinal axis. The device further includes one or more contact elements disposed on at least one of the third and the fourth surfaces at one or more contact locations, each of the contact locations at least partially aligned between the first and the second electrodes of one of the pairs of excitation electrodes. In the device the piezoelectric body has a first order natural resonance frequency ($v_1$) for a first standing longitudinal wave in a direction of the second longitudinal axis, an even order natural resonance frequency ($v_2$) for a second standing longitudinal wave in a direction of the first longitudinal axis, and a percent difference between $v_1$ and $v_2$ is greater than 0% and less than or equal to 20%.

In a second embodiment of the invention, a fuel cell pump including a piezoelectric motor is provided. The piezoelectric motor includes a piezoresonator body having opposing upper and lower surfaces and opposing front and back surfaces, the front and the back surfaces being parallel to a first and second longitudinal axes of the piezoresonator body, the first and the second longitudinal axes being perpendicular to each other, and the upper and the lower surfaces being parallel to the first longitudinal axis and perpendicular to the second longitudinal axis. The motor also includes at least one common electrode disposed on the back surface and a plurality of electrodes disposed on the front surface along the first longitudinal axis, the plurality of electrodes includes one or more pairs of excitation electrodes. The motor further includes a plurality of contact elements disposed on the upper and the lower surfaces at contact locations along the first longitudinal axis, each of the plurality contact elements associated with one of the pairs of excitation electrodes. In the motor, the piezoelectric body has a first order natural resonance frequency ($v_1$) for a first standing longitudinal wave in a direction of the second longitudinal axis, an even order natural resonance frequency ($v_2$) for a second standing longitudinal wave in a direction of the first longitudinal axis, and a percent difference between $v_1$ and $v_2$ is greater than 0% and less than or equal to 20%.

In a third embodiment of the invention, a piezoelectric device is provided. The device includes a piezoresonator body having opposing first and second surfaces and opposing third and fourth surfaces, the first and the second surfaces being substantially parallel to first and second longitudinal axes of the piezoresonator body, the third and the fourth surfaces being substantially parallel to the first longitudinal axis and substantially perpendicular to the second longitudinal axis, and the first and the second longitudinal axes being substantially perpendicular to each other. The device also includes at least one common electrode disposed on the back surface of the piezoresonator and a plurality of electrodes disposed on the first surface, the plurality of electrodes includes one or more pairs of excitation electrodes, each of the pairs of excitation electrodes includes a first electrode and a second electrode positioned along a first direction along the first longitudinal axis. The device further includes one or more contact elements disposed on at least one of the third and the fourth surfaces at one or more contact locations, each of the contact locations at least partially aligned between the first and the second electrodes of one of the pairs of excitation electrodes. The device also includes at least one driven element in friction contact with the plurality of contact elements and an excitation source connected to the one common electrode and to the pairs of excitation electrodes. In the device, the piezoelectric body has a first order natural resonance frequency ($v_1$) for a first standing longitudinal wave in a direction of the second longitudinal axis and a even order natural resonance frequency ($v_2$) for a second standing longitudinal wave in a direction of the first longitudinal axis, where a percent difference between $v_1$ and $v_2$ is greater than 0% and less than or equal to 20%. In the device, the excitation source is configured for applying an alternating voltage to the common electrode and one of the first and the second electrodes of each of the pairs of excitation electrodes to simultaneously generate the first standing longitudinal wave and the second standing longitudinal wave in the piezoelectric body.

BRIEF DESCRIPTION OF THE FIGURES

FIG. 4 is a schematic illustration of a perspective view of an exemplary piezoresonator configured for a second order longitudinal vibrational mode along its length and for a first order longitudinal vibrational mode along its width in accordance with an embodiment of the present invention.

DETAILED DESCRIPTION

Figure 1:
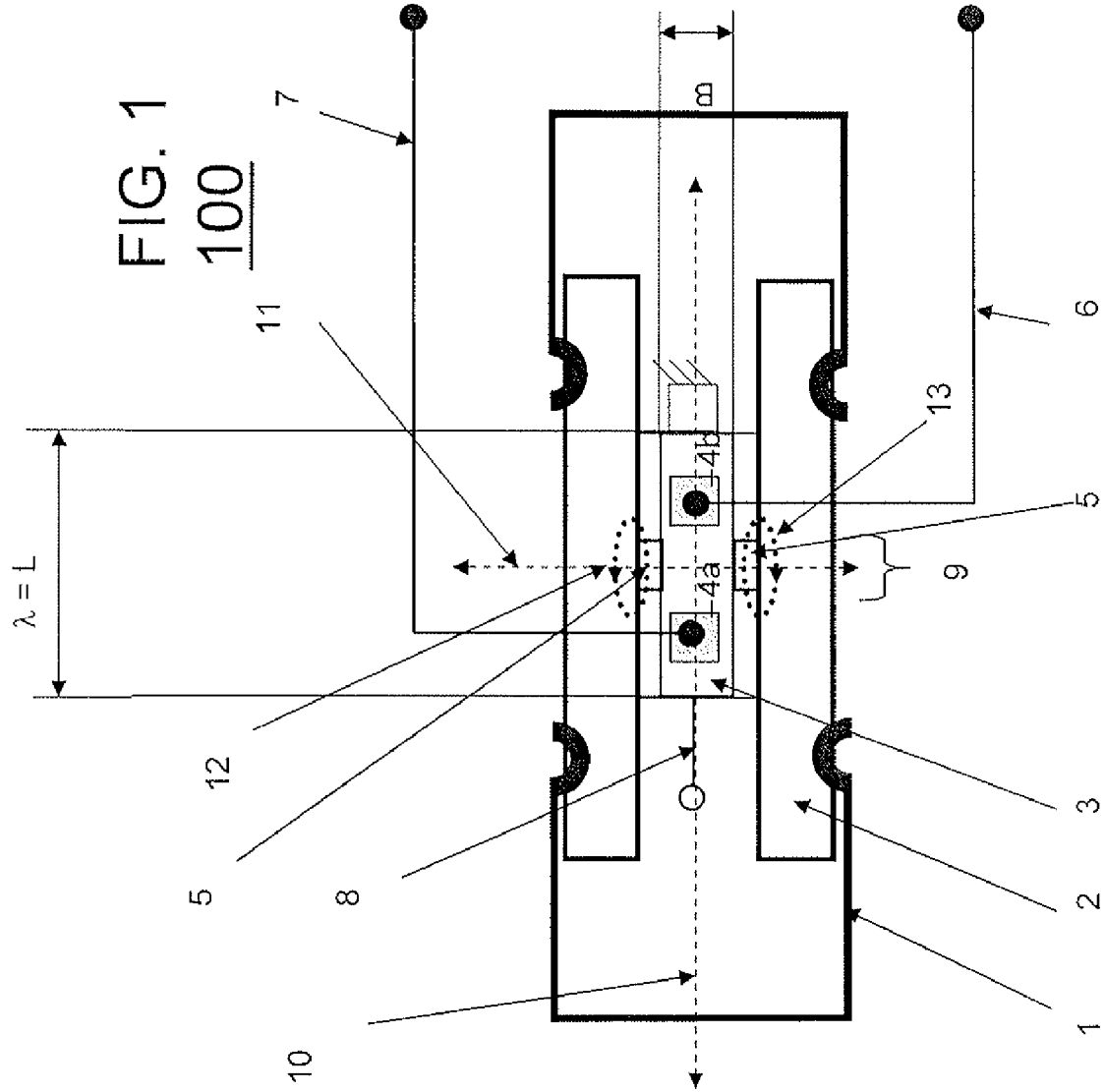
FIG. 1 is a schematic illustration of a side view of an exemplary piezoelectric actuator configured for a second order longitudinal vibrational mode along its length and for a first order longitudinal vibrational mode along its width in accordance with an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

One substantial limitation of using a conventional 2-D wave excited piezoelectric motors as actuators, such a flat piezoelement-based motors, is the low efficiency associated with the typically resulting linear motion of the contact point. The reason for this low efficiency is that the direction of this linear motion is generally at an angle with respect to the direction of travel of the moving stage. As a result, only fraction of the force generated by the piezoelement (i.e. the projection of this force on the direction of travel of the moving stage) is generally applied to the moving stage. Furthermore, the vibrational movement of the contact point in such actuators is generally the result of a single plane wave, which causes expansion and contraction of a square piezoelectric resonator with side $\lambda/2$ with a contact point located on a diagonal. Therefore, such systems, which generally operate based on designs incorporating simple contraction and expansion of the piezoelement, limit the number of contact points possible. As a result, one disadvantage of this design is that a large number of contact points are generally not possible.

Furthermore, such designs typically use one or more contact or friction points attached to the surface of a piezoelement to provide mechanical coupling during operation. However, such a layer will typically result in some internal dissipation of energy during the transfer of acoustic energy from the oscillator to the driven element. As a result the efficiency of the system is typically adversely affected in such configurations.

In view of these limitations, the various embodiments of the present invention provide a new piezoelectric motor. In particular, the new piezoelectric motor is a resonance-type piezoelectric motor using standing acoustic waves. The new piezoelectric motor operates by providing high efficiency nano-elliptical motion at different contact points on the piezoelectric element to provide lateral motion or the piezoelement or the stage, as described below. The high efficiency of this new piezoelectric motor stems from the fact that when the contact points are acting on the moving stage, the contact points are moving along the top portion of a relatively flat elliptical path. Therefore, a substantial portion of the force applied by the contact points against the stage is in a direction generally parallel to the direction of motion. The nano-elliptical motion at a contact point is provided by the superposition of two orthogonal standing waves, as opposed to a single plane wave. As a result, excitation of higher order modes can be performed and a large number of contact points can be provided for the actuator.

Resonant piezoelectric motors with standing acoustic waves create motion from rotational deformations. These rotational deformations are generally in the form of very small nano-ellipses. To create a motion using multiple contact points, nano-ellipses of rotational movement must be established with similar or corresponding directions of rotational deformation. For example, for symmetrically situated points on a first side of a piezoresonator, the elliptical rotations are generally in the first rotational direction to provide linear movement in a first linear direction. For points on a second side of the piezoresonator the elliptical rotations are generally in a second rotational direction, opposite to the first rotational direction, to provide linear movement in the first linear direction. As a result, the contact points on opposite site function cooperatively by applying force in a same direction even though their rotational directions are different.

A piezoresonator in accordance with an embodiment of the invention includes electrodes and leads coupled to opposite sides of the piezoresonator for excitation of longitudinal vibrations, in particular standing acoustic waves. The longitudinal vibrations cause motion of contact sites, which interact by friction with guides through contact elements on upper and lower surfaces of the piezoresonator. In some embodiments of the invention, the contact elements are integrally formed with the piezoresonator. The piezoresonator can be held against the guides under pressure provided by a pressure-creating device, such as spring. The contact sites are situated at the place of maximum vibrational velocity of the resonator. The size of the piezoresonator and the locations of the electrodes are selected to satisfy the conditions for simultaneous formation of higher order longitudinal vibrational modes in a first direction of the piezoresonator along the length of the piezoresonator and conditions for excitation of a first order longitudinal vibrational mode in a second direction along the width of the piezoresonator. Further, in the various embodiments of the present invention, the natural frequencies (resonant frequencies) along the first and second directions are different and an alternating voltage source having a frequency between the natural frequencies along the first and second directions is used for exciting the piezoresonator during forward or reverse motion.

Figure 2:
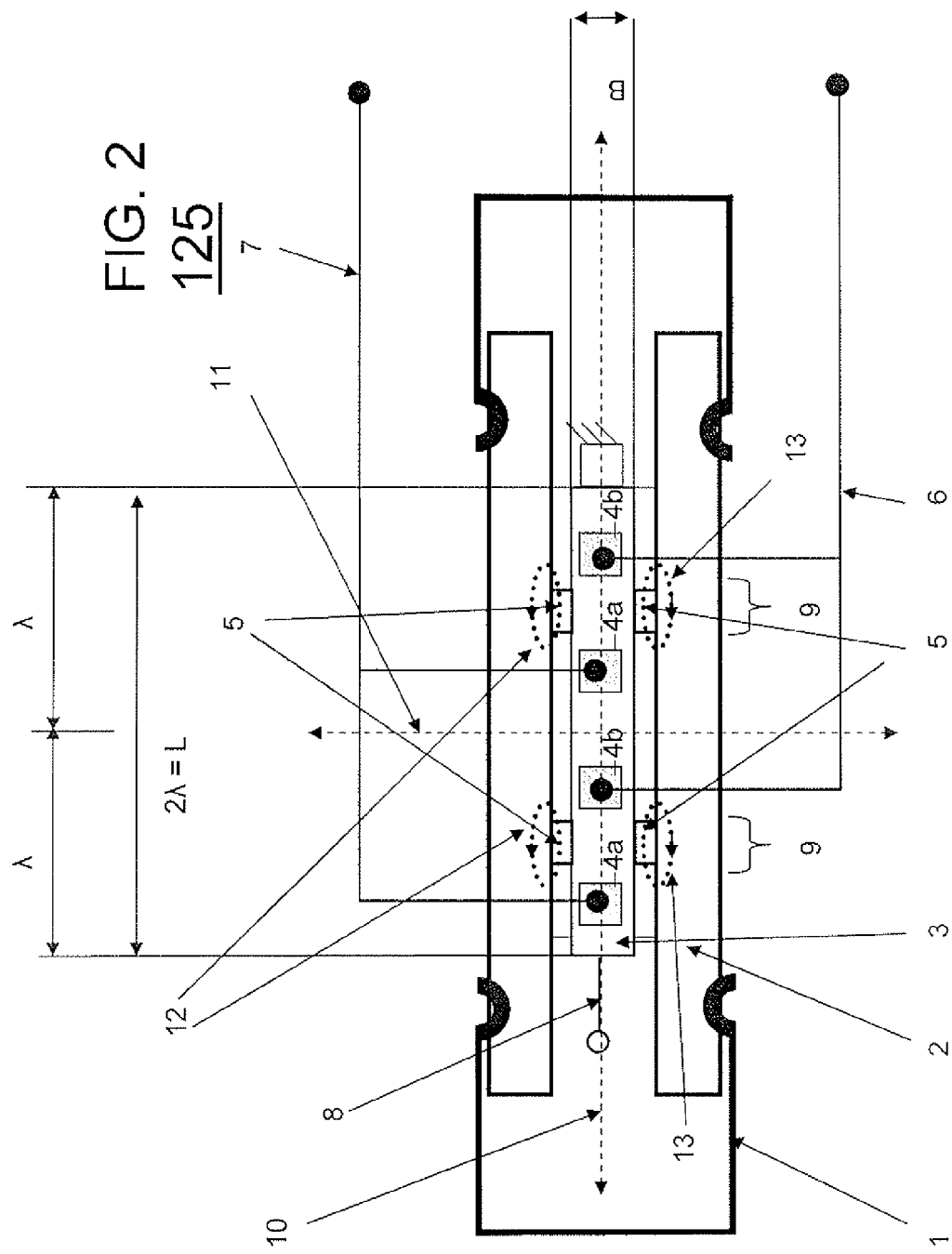
FIG. 2 is a schematic illustration of a side view of an exemplary piezoelectric actuator configured for a fourth order longitudinal vibrational mode along its length and for a first order longitudinal vibrational mode along its width in accordance with an embodiment of the present invention.
Figure 3:
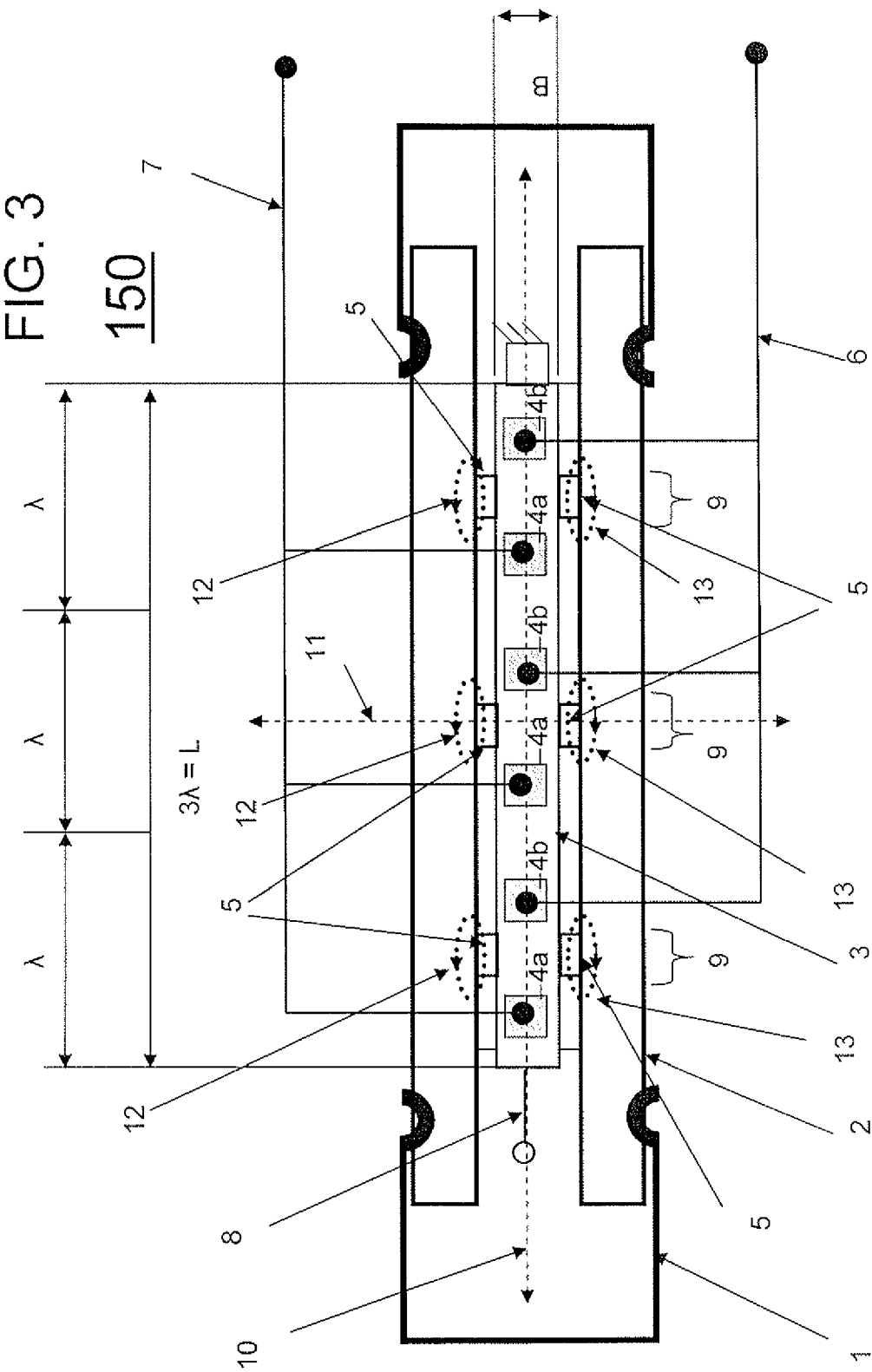
FIG. 3 is a schematic illustration of a side view of an exemplary piezoelectric actuator configured for a sixth order longitudinal vibrational mode along its length and for a first order longitudinal vibrational mode along its width in accordance with an embodiment of the present invention.

The various embodiments of the present invention will be described with respect to FIGS. 1-4. FIG. 1 is a schematic illustration of a side view of an exemplary piezoelectric actuator (100) configured for a second order longitudinal vibrational mode along its length (n=2) and for a first order longitudinal vibrational mode along its width in accordance with an embodiment of the present invention. FIG. 2 is a schematic illustration of a side view of an exemplary piezoelectric actuator (125) configured for a fourth order longitudinal vibrational mode along its length (n=4) and for a first order longitudinal vibrational mode along its width in accordance with an embodiment of the present invention. FIG. 3 is a schematic illustration of a side view of an exemplary piezoelectric actuator (150) configured for a sixth order longitudinal vibrational mode along its length (n=6) and for a first order longitudinal vibrational mode along its width in accordance with an embodiment of the present invention. FIG. 4 is a schematic illustration of a perspective view of an exemplary piezoresonator (175) configured for a second order longitudinal vibrational mode along its length (n=2) and for a first order longitudinal vibrational mode along its width in accordance with an embodiment of the present invention.

As shown in FIGS. 1-4, the exemplary piezoelectric actuators (100, 125, 150, 175) each comprise a piezoresonator (3) and contact elements (5). The exemplary piezoelectric actuators (100, 125, 150) also comprise guides (2) and a spring (1). In operation, excitation of the piezoresonator (3) in accordance with an embodiment of the present invention causes motion of the contact elements (5) along a nano-elliptical paths (12, 13). In general, the elliptical paths (12, 13) have amplitudes (i.e. dimensions of the minor and major axes) on the order of tens to hundreds of nanometers and are generally flat with respect to the direction of motion. That is, the major axis of the resulting elliptical paths (12, 13) is generally located in a direction parallel to the direction of motion. When the contact elements (5) are at a point along the elliptical paths (12, 13) furthest in from the piezoelement, they interact by friction with the guides (2) to initiate a linear micro-motion of the piezoresonator (3) in respect to guides (2). Spring (1) provides a normal force to piezoresonator (3) and guides (2) to assure an adequate friction force. When the contact elements (5) are at a point along the elliptical paths (12, 13) closest to the piezoresonator (3), little or no friction occurs between the contact elements (5) and the guides (2), resulting in little or no motion. As vibration continues, the micro-movement is repeated, which results in repetitive movement of the piezoresonator (3) in respect to the guides (2).

In the various embodiments of the present invention, the exemplary piezoelectric actuators (100, 125, 150, 175) can be configured such that the guides (2) or the piezoresonators (3) provide the linear motion for the actuator. That is, either the position of the guides (2) or piezoresonators (3) can be fixed. In the case where the position of the guides (2) is fixed, the piezoresonator (3) is attached to the stage (18) to be moved. As a result, the nano-elliptical motion of the contact elements (5) results in motion of the piezoresonator (3) and the attached stage. In contrast, in the case where the position of the piezoresonator (3) is fixed, the guides (2) are attached to the stage (18) to be moved. As a result, the nano-elliptical motion of the contact elements (5) results in motion of the guides (2) and the attached stage. In contrast to conventional piezoelectric actuators, such a configuration provides additional design flexibility.

In the various embodiments of the present invention, the nano-elliptical motion of the contact elements (5) is formed by a superposition of two standing waves associated with orthogonal vibrational modes of the piezo-electric resonator or piezoresonator (3) such that the points of maximum vibrational velocity (9) correspond with the position of the contact elements (5). That is, the points in the piezoresonator (3) in which the standing waves of both of the orthogonal vibrational modes peak. The vibrational modes are excited by providing an excitation voltage via one of a pair of electrodes (4a) and (4b) (collectively "(4)") associated with each of contact elements (5). That is, to provide nano-elliptical paths in a first direction and that provide force in a first direction toward electrodes (4a), excitation voltages are provided at electrodes (4a). To provide similar nano-elliptical paths, but that provide force in an opposite direction (towards electrodes (4b)), excitation voltages are provided at electrodes (4b). The excitation voltage is provided via a ground or common contact (8) and one of excitation contacts (6, 7) contacting electrodes (4b, 4a) respectively, as described below.

One of the vibrational modes is a longitudinal vibration resulting from a standing wave formed along a first longitudinal axis (10) along the length (L) of the piezoresonator (3). The other vibrational mode is a longitudinal vibration along a second longitudinal axis (11), perpendicular to the first longitudinal axis (10) and along the width (B) of the piezoresonator (3). Thus the piezoresonator (3) combines two linear resonators—one acting along the length (L) of the piezoresonator (3) and one acting across its width (B). The piezoresonator (3) is therefore effectively a 'combined resonator' in that it entails the independent and simultaneous excitation of two orthogonal oscillations to provide the nano-elliptical motion in the plane defined by the longitudinal axes (10, 11).

In the various embodiments of the present invention, coupling between the two types of orthogonal vibrations needs to be excluded in order to provide maximum vibrational velocity for the contact elements (5). In general, if such coupling occurs, energy is transferred from one vibrational mode to the other instead of energy being used for providing motion of the contact elements (5). However, the Present Inventors have discovered that this coupling can be eliminated if the fundamental (first order) longitudinal mode is excited across the width (B) of the piezoresonator (3) and a higher order longitudinal overtone modes (n=2, 4, 6 . . . ) is simultaneously excited along the length (L) of the piezoresonator (3).

In general, the conditions for excitation of the first order longitudinal mode across the width of the resonator can be expressed by the following equations:

$$\lambda_1/2 = B, \quad (1)$$

$$\lambda_1 * v_1 = C, \quad (2)$$

where $\lambda_1$ is the wavelength of the wave across the width of the combined resonator, B is the width of the combined resonator, $v_1$ is the natural frequency of the resonator along width B, and C is the speed of propagation of the acoustic waves in the resonator. The conditions for excitation of the higher order longitudinal vibration along the length of the resonator can be generally expressed by the following equations:

$$n*(\lambda_2/2) = L, \quad (3)$$

$$\lambda_2 * v_2 = C, \quad (4)$$

where $\lambda_2$ is the wavelength of the wave along the length of the combined resonator, L is the length of the combined resonator, n=2, 4, 6 . . . (i.e., the order of the vibration), $v_2$ is the natural frequency of the resonator; corresponding to $\lambda_2$, and C is speed of propagation of the acoustic waves in the resonator. $v_1$ and $v_2$ can be mutually related in various ways depending on the geometrical parameters of the piezoresonator (3).

In the various embodiments of the present invention, nano-ellipses (12, 13) on opposite faces of the piezoresonator (3) are also generally configured to rotate in opposite directions. This allows the piezoresonator (3) to push off the guides (2) in same direction as the contact elements (5) on both sides of the piezoresonator (3) move synchronously in the opposite directions. For example, as shown in FIGS. 1-3, motion along nano-ellipse(s) (12) is counter-clockwise while motion along nano-ellipse(s) (13) is clockwise.

In general, to provide nano-elliptical motion such that the directions of elliptical paths (12, 13) are opposite, formation of two perpendicular standing waves in the piezoresonator (3) is generally required. These standing waves are generally the result of providing excitation voltages in each of the perpendicular directions. Typically, such a system of excitation would require excitation of a piezoresonator using two different sources of alternating voltage with equal frequencies, but shifted in phase relative to each other by approximately 90° and a special arrangement of electrodes. Unfortunately, such a two-generator excitation system is typically complex and requires that high stability of the phase relationship be maintained, as any unbalance directly affects the basic performance of the motor. This generally imposes additional requirements on the control of the excitation system and increases overall costs.

However, the present inventors have discovered that nano-ellipses can be excited using an excitation source operating a third frequency $v_3$ adjacent to $v_1$ and $v_2$, but not coincident with either $v_1$ or $v_2$. Such a frequency allows formation of nano-ellipses at the central opposing maxima of vibrational velocities of the piezoresonator, assuring opposing rotation on opposite sides of the piezoresonator. Therefore, in the various embodiments of the invention, one source of alternating voltage at frequency $v_3$ is used to excite the two modes simultaneously without the need for a special configuration of the excitation electrodes, described above. Thus, a single excitation source combination resonator is provided in the various embodiments of the invention. That is, a longitudinal resonator is provided along the length and a longitudinal resonator is provided across the width, where the same electrodes independently and simultaneously excite the two types of orthogonal vibrations.

Figure 5A:
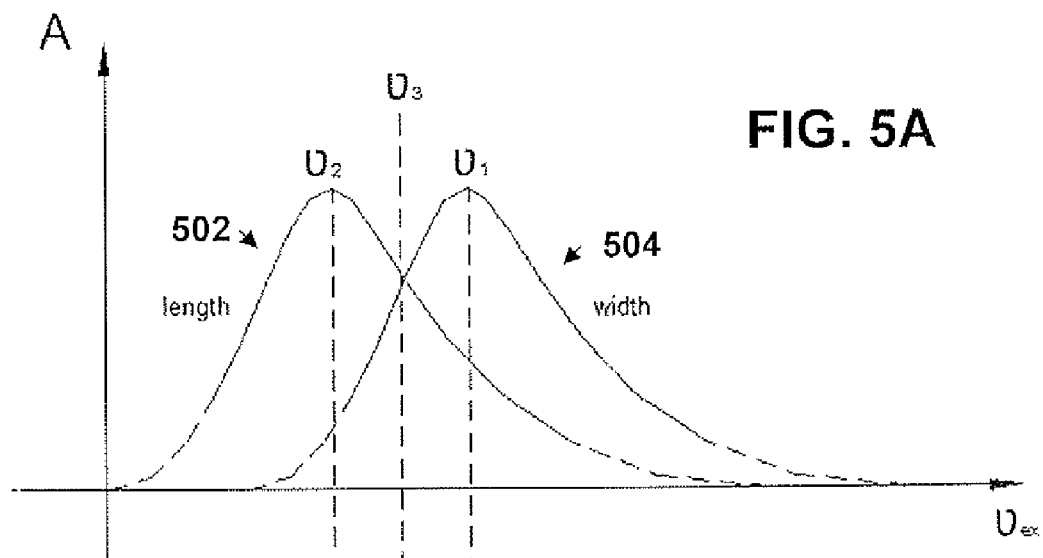
FIG. 5A is an X-Y plot of frequency versus amplitude, showing the frequency response of a piezoresonator along its width and height.
Figure 5B:
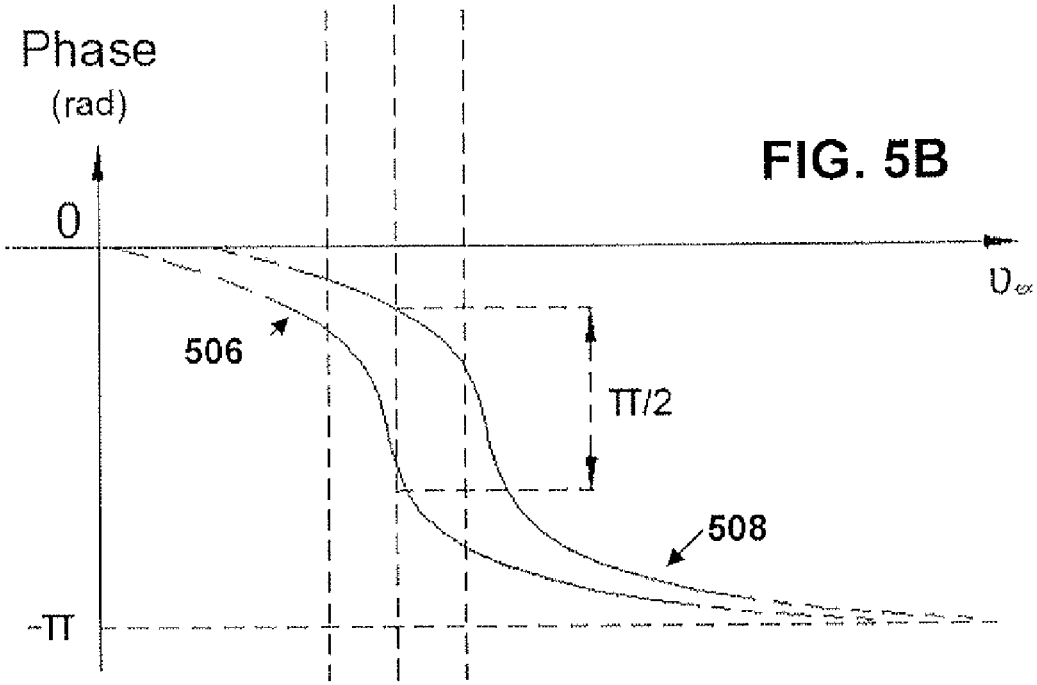
FIG. 5B is an X-Y plot of frequency versus phase for the system with the frequency response shown in FIG. 5A, showing the phase response of a piezoresonator along its height and width.

Although any $v_3$ adjacent to $v_1$ and $v_2$ can be used to excite the piezoresonator, $v_3$ can be selected to improve the amplitudes of vibration in the two directions. This is illustrated in FIGS. 5A and 5B. FIG. 5A is an X-Y plot of frequency versus amplitude, showing the frequency response of a piezoresonator along its width and length, where the length is approximately 5 times the width. In FIG. 5A, where the X-axis represents the excitation frequency $v_{ex}$ of the resonator, and the Y-axis represents the amplitude of acoustic vibrations resulting from excitation. In general, as an excitation frequency approaches the resonant frequency of a dimension, the amplitude of the acoustic waves formed increases. In general, this resulting amplitude is frequency dependent, with a peak at the resonant frequency for a dimension of the piezoresonator. This response profile is illustrated in FIG. 5A by curves 502 and 504. Curve 502 represents a response curve for a piezoresonator along its length and curve 504 represents the response curve for a piezoresonator along its width. Further, the resonant frequency $v_1$ corresponds to the natural resonant frequency of the longitudinal vibrations across the width of the combination resonator, and frequency $v_2$ corresponds to the natural resonant frequency of longitudinal vibrations along the length of the piezoresonator.

As shown in FIG. 5A, curves 502 and 504 overlap. Accordingly, to provide substantial excitation along the length and width of the piezoresonator in the various embodiments of the invention, an excitation frequency $v_3$, between $v_1$ and $v_2$, can selected at a point at which curves 502 and 504 substantially overlap each other. However, if $v_3$ is also selected by considering the phase characteristics of the resulting waves, the amplitude of excitation along the length and width can also be improved. This is illustrated with respect to FIG. 5B.

FIG. 5B is an X-Y plot of frequency versus phase for the system with the frequency response shown in FIG. 5A, showing the phase responses 506 and 508 of a piezoresonator along its height and width, respectively. As shown in FIG. 5B, there is an intermediate frequency $v_3$ at which excitation yields a phase difference of $\pi/2$ between vibrations across the length and across the width. Thus, exciting the piezoresonator at or near this frequency results in an excitation of two orthogonal vibrations along the width and the length of the resonator with a difference of approximately $\pi/2$ between them. The superposition of these two vibrations yields a nano-ellipse with central opposing maxima of the vibrational velocities at the sites of the contact elements. Accordingly, such a selection of $v_3$ allows a new methodology for simultaneous excitation of vibrational modes along both the length and width of the piezoresonator.

Therefore, In the various embodiments of the present invention, the opposite motion in the nano-ellipses (12, 13) can be provided using a single excitation voltage source by selection of the geometric dimensions of the piezoresonator (3) to provide some separation between the natural frequencies $v_1$ and $v_2$ for the piezoresonator (3) in directions parallel to the first (10) and second (11) longitudinal axes. In particular, the geometric dimensions of the piezoresonator (3) are selected so that L≠2B. Thus, the combined resonator frequencies are no longer the same along its orthogonal directions, but give rise to two frequencies $v_1$ and $v_2$, where $v_1 \neq v_2$ and where $v_1$ and $v_2$ are separated according to the expression:

$$\frac{v_1 - v_2}{(v_1 + v_2)/2} * 100\% \leq 20\%. \tag{5}$$

For example, $v_1$ and $v_2$ can be separated by 5%, 10%, 15%, or 20%. As a result, a third frequency $v_3$ between $v_1$ and $v_2$ can be selected to excite the piezoresonator (3) that also causes nano-ellipses to be formed at the center of the opposite sides of the piezoresonator (3). Further, $v_1$ and $v_2$ can be selected such that the resulting response profiles substantially overlap, as described above with respect to FIG. 5A. Alternatively, $v_1$ and $v_2$ can be selected such that the phase difference is $\pi/2$, as described above with respect to FIG. 5B. This results in a quasi-resonant state since $v_3$ is between $v_1$ and $v_2$. For excitation at this frequency $v_3$, both nano-ellipses (12, 13) are formed and they coincide with the points of maximum vibrational velocity (9) and have opposite rotations without requiring an arrangement of multiple voltage sources. This approach simplifies the design of the excitation system. As a result, in the various embodiments of the present invention, only one source of alternating voltage with a frequency $v_3$ is generally necessary.

Furthermore, the excitation voltage can be applied to one of excitation contacts (6, 7) such either forward or reverse motion parallel to longitudinal axis (10) is provided. In the various embodiments of the present invention, this can be achieved by the excitation an appropriate one of electrodes (4a, 4b). That is, to provide motion in a first direction parallel to longitudinal axis (10), the piezoresonator is configured to generate the nano-elliptical paths for the contact elements (5) shown in FIGS. 1-3 (i.e., the counter-clockwise motion of the elliptical path (12) and the clockwise motion of the elliptical path (13)). In such a configuration, the excitation voltage is applied via excitation contact (6) to electrode (4a) and common electrode (8), while electrode (4b) is allowed to float. In contrast, to provide motion in a second direction parallel to longitudinal axis (10) and opposite to the first direction, the piezoresonator is configured to generate nano-elliptical paths for the contact elements (5) opposite to shown in FIGS. 1-3 (i.e., the clockwise motion of the elliptical path (12) and the counter-clockwise motion of the elliptical paths (13)). In such a configuration, the excitation voltage is applied only to electrode (4b) and common electrode (8) and electrode (4a) is allowed to float.

In some embodiments of the present invention, the piezoresonator (3) is substantially cuboid. The term "cuboid", as used herein refers to a solid figure bounded by six faces. For example, the piezoresonator can be made in the form of a rectangular plate with length L along the first longitudinal axis (10) and a width B along the second longitudinal axis (11). These surfaces bounded by width B and length L (and parallel to the longitudinal axes (10, 11)) define front (14) and back plate (15) surfaces. The surfaces along length L perpendicular to the second longitudinal axis (11) define upper (16) and lower (17) surfaces of the plate. The piezoresonator (3) can be polarized normal to the front and back plate surfaces (14, 15) so that the movable part of the motor allows linear movement along dimension L. In such embodiments, the contact elements (5) are positioned on the upper and lower surfaces (16, 17) of the piezoresonator. In the various embodiments of the present invention, the piezoresonator (3) is installed in spring-loaded guides (1, 2) which provide pressure contact between the contact sites (5) of the piezoresonator (3) and the guides (2).

In the various embodiments of the present invention, the sites or locations of the contact elements (5) are defined by $(2i+1)(L/n)$, where n is the order of the longitudinal vibration mode (i.e., n=2, 4, 6, . . . ), as described above, and i is an integer defined by $(n-2)/2 \geqq i \geqq 0$. Additionally, the electrodes (4) are located in pairs (4a, 4b) on the front surface (14) the piezoresonator (3), as previously described, to provide a forward or reverse motion. The first of these paired electrodes (4a) is located at positions between $2i(L/n)$ and $(2i+1)(L/n)$. The second of these pair electrodes (4a) is located at positions between $(2i+1)(L/n)$ and $(2i+2)(L/n)$. Accordingly, across the length of the piezoresonator (3), the electrodes (4a, 4b) alternate.

In some embodiments of the present invention, the piezoresonator (3) satisfies the conditions for formation of a second order vibrational mode along the length L, as shown in FIG. 1. In such embodiments, a pair of contact elements (5) are located on the upper and lower surfaces (16, 17) of the piezoresonator (3), with one common electrode (8) contacting the back plate surface (15) and two others (4a, 4b) contacting the front plate surface (14). These other electrodes (4a, 4b) dividing the front surface (14) into two equal electrode areas each with length L/2, where the first electrode (4a) is connected to a first excitation contact (7), and the second electrode (4b) is connected to a second excitation contact (6).

In other embodiments of the present invention, the piezoresonator (3) satisfies the conditions for formation of a fourth order vibrational mode along the length L, as shown in FIG. 2. In such embodiments, multiple pairs of contact elements (5) are located on the upper and lower surfaces (16, 17) of the piezoresonator (3), with one common electrode (8) contacting the back plate surface (15) and two pairs of electrodes (4) contacting the front plate surface (14). The pairs of electrodes (4) divide the front surface (14) into four equal electrode areas each with length L/4, where the first and third electrodes (4a) are connected to each other and a first excitation contact (7), and the second and fourth electrodes (4b) are connected to each other and a second excitation contact (6).

In yet other embodiments of the present invention, the piezoresonator (3) satisfies the conditions for formation of a sixth order vibrational mode along the length L, as shown in FIG. 2. In such embodiments, multiple pairs of contact elements (5) are located on the upper and lower surfaces (16, 17) of the piezoresonator (3), with one common electrode (8) contacting the back plate surface (15) and 3 pairs of electrodes (4) contacting the front plate surface (14). These pairs of electrodes (4) divide the front surface (14) into 6 equal electrode areas each with length L/6, where the first, third, and fifth electrodes (4a) are connected to each other and a first excitation contact (7), and the second, fourth, and sixth electrodes (4b) are connected to each other and a second excitation contact (6).

Therefore, as described above, applying an appropriate excitation voltage at a frequency $v_3$, as described above, at common electrode (8) and excitation contact (6) provides motion in a first direction and applying the same excitation voltage at common electrode (8) and excitation contact (7) provides the same amount of motion, but in an opposite direction.

Figure 6:
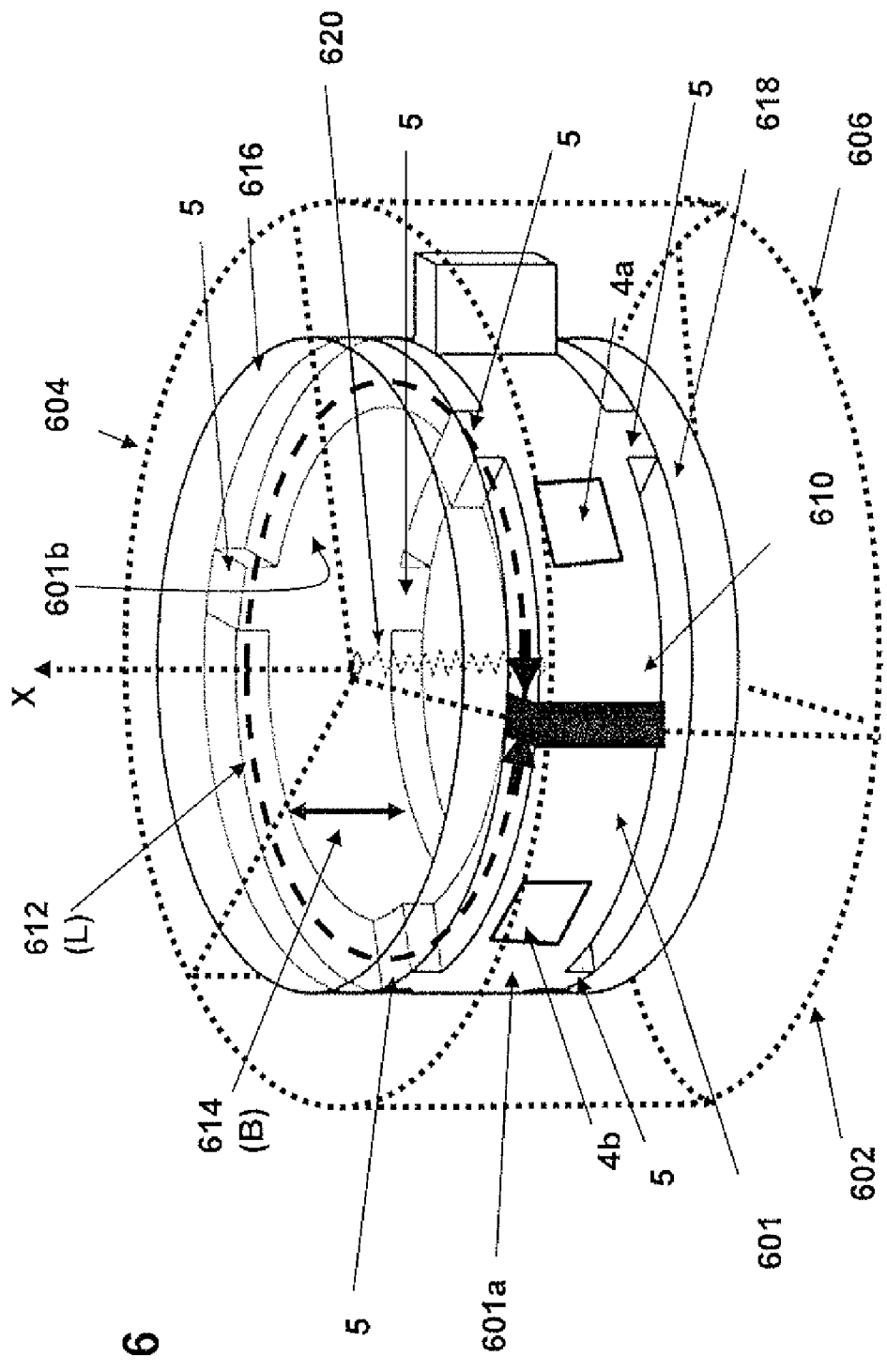
FIGS. 6 and 7 are schematic illustrations of portions of cylindrical piezoelectric motors in accordance with other embodiments of the invention.
Figure 7:
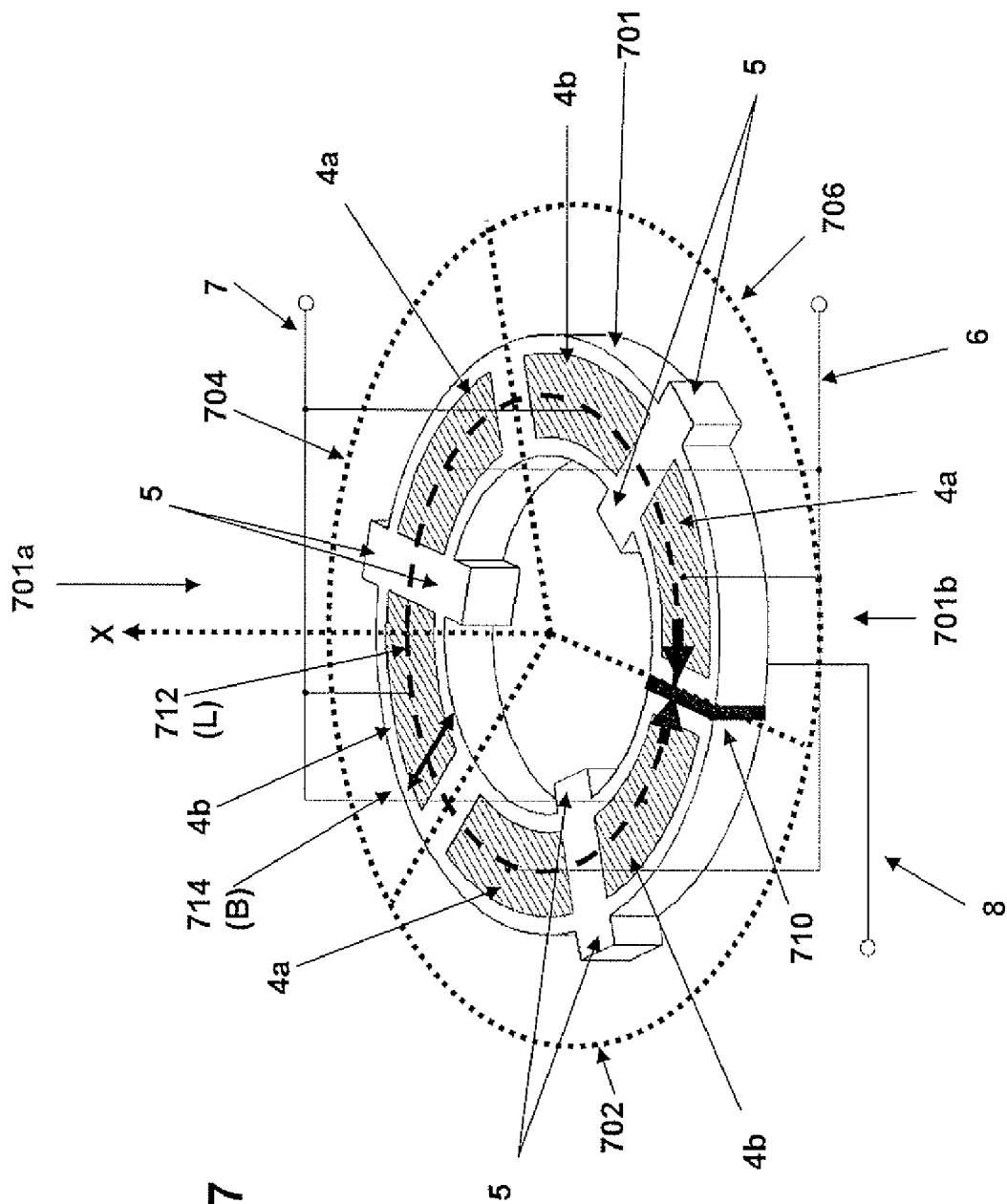

Although the various embodiments of the invention have been described above with respect to a linear piezoelectric motor, the piezoelectric actuators of FIG. 4 can also be used to provide circular piezoelectric motor designs, as shown in FIGS. 6 and 7. FIGS. 6 and 7 are schematic illustrations of portions of cylindrical piezoelectric motors in accordance with other embodiments of the invention. In such configurations, one or more piezoelectric actuators are arranged along a first longitudinal axis defined by a circular axis to provide substantially cylindrical piezoresonators in which standing acoustic waves are generated in a direction along the circular axis (first longitudinal axis) and along a second axis or direction (second longitudinal axis) substantially perpendicular to the circular axis. As used herein, the term "circular axis" refers to an axis defined by a circumference of a circle. These piezoelectric actuators are configured similar to those shown in FIGS. 1-4, as described below. Accordingly, the description above for components 4a, 4b, 5, 6, 7, and 8 is sufficient for purposes of describing these components in FIGS. 6 and 7.

In a first exemplary cylindrical configuration, as shown in FIG. 6, a piezoresonator 601 is provided by also disposing three piezoelectric actuators 602, 604, and 606 along a circular axis 612 about axis X. Further, the actuators 602-606 are arranged so that the contact elements 5 extend parallel to axis X. As a result, electrodes 4a and 4b are disposed on the outer surface 601a of piezoresonator 601 in a configuration similar to that of the electrodes disposed on the front surfaces in FIGS. 1-4. Common electrode 8 is disposed on the inner surface 601b of piezoresonator 600 in a configuration similar to that of the electrodes disposed on the back surfaces in FIGS. 1-4. In such configurations, the length (L) of the piezoresonator 601 can be defined by the circumference of the circular axis 612 and is equivalent to the length of a linear resonator described above with respect to FIGS. 1-4. Similarly, the height 614 of the piezoresonator 601 would be equivalent to the width (B) of the linear resonator, as described above with respect to FIGS. 1-4. Accordingly, the dimensions and excitation frequency can be selected for piezoresonator 601 in accordance with the methods described above to provide simultaneous excitation of standing longitudinal waves along directions parallel to 612 and 614 using a single excitation source applied to electrodes 4a or 4b. Such a design can be used to rotate one or more rotors 616, 618. In the case of two rotors, a spring or other elastic component 620 can be used to bias the rotors 616 and 618 against piezoresonator 3, similar to the way the springs bias the guides against the piezoresonator in FIGS. 1-3.

However, when such a cylindrical system is excited, a parasitic radial mode of vibration can also excited. In general, a parasitic radial mode in a piezoresonator is capable of suppressing all other desired modes of vibrations in a cylindrical piezoresonator due to energy coupling. Therefore, in the embodiments of the invention using cylindrical piezoresonators, a complete or partial cut or slit 610 can be introduced halfway between two adjacent contact points 5. The slit 610 prevents the propagation of a radial mode of vibration. As a result, the piezoresonator 601 can be substantially cylindrical in that in some embodiments, a complete cylinder may not be formed by the piezoresonator.

In a second cylindrical configuration, as shown in FIG. 7, a piezoresonator 701 is provided by disposing three piezoelectric actuators 702, 704, and 706 along a circular axis 712 disposed about an axis X. However, the actuators 702-706 are arranged so that the contact elements 5 extend radially with respect to axis X and perpendicular to circular axis 712. As a result, electrodes 4a and 4b are disposed on the upper surface 701a of piezoresonator 701 in a configuration similar to that of the electrodes disposed on the front surfaces in FIGS. 1-4. Common electrode 8 is disposed on the lower surface 701b of piezoresonator 700 in a configuration similar to that of the electrodes disposed on the back surfaces in FIGS. 1-4. Thus, while piezoresonator 701 has a cylindrical shape, it is configured to operation as an annular or ring-type shaped piezoresonator. In such configurations, the length (L) of the piezoresonator 701 can be defined by the circumference of the circular axis 712 and is equivalent to the length of a linear resonator described above with respect to FIGS. 1-4. Similarly, the annular width 714 of the piezoresonator 701 would be equivalent to the width (B) of the linear resonator, as described above with respect to FIGS. 1-4. As used herein, the term "annular width" refers to the width of an annulus or ring along a radial direction. Accordingly, the dimensions and excitation frequency can be selected for piezoresonator 701 in accordance with the methods described above to provide simultaneous excitation of standing longitudinal waves along directions parallel to 712 and 714 using a single excitation source applied to electrodes 4a or 4b.

However, when such an annular system is excited, a parasitic radial mode of vibration can also excited. In general, the parasitic radial mode is capable of suppressing all other desired modes of vibrations in a annular piezoresonator due to energy coupling. Therefore, in the embodiments of the invention using annular piezoresonators, a complete or partial cut or slit 710 is introduced halfway between two adjacent contact points 5. The slit 710 prevents the propagation of a radial mode of vibration. As a result, the piezoresonator 701 can be substantially cylindrical in that in some embodiments, a complete cylinder may not be formed by the piezoresonator.

Although the exemplary embodiments of circular piezoelectric motors are shown as including only a limited number of piezoelectric actuator, the various embodiments of the invention are not limited in this regard. In other embodiments of the invention, any number of piezoelectric actuators with any number of contact elements and electrodes can be used.

An example of an application of the motor described herein would include its incorporation as the motor element part of a micro fuel cell pump. A compact, economical and quiet air pump is generally needed as part of a new generation of efficient fuel cells. For example, a rotary impeller pump using a flat piezoresonator as an actuator, working on the principle of excitation of longitudinal vibrational modes along the length and the width of the piezoresonator to cause rotation of a rotor to which a fan is attached. However, the rotary pumps described herein can be used with any type of actuator devices, including piezoresonators.

Figure 8A:
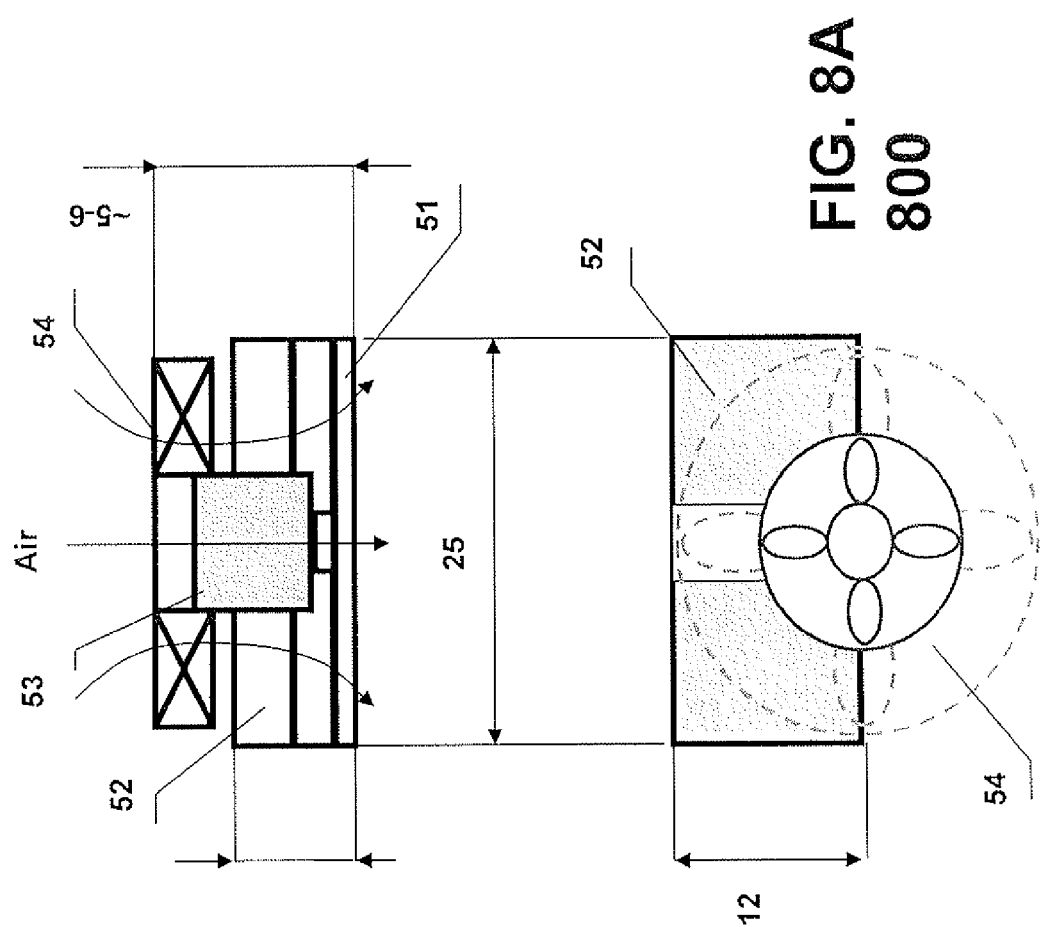
FIG. 8A shows a rotary pump 800 using a single fan and a piezoresonator configured in accordance with an embodiment of the present invention.
Figure 8B:
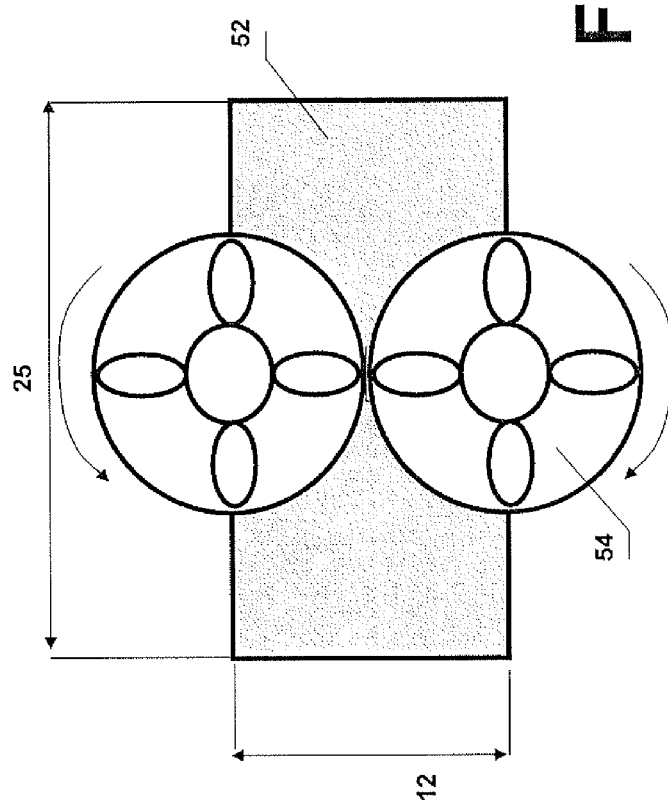
FIGS. 8B and 8C show top and side views, respectively, of a rotary pump 850 with two fans having opposite directions of rotation, which provides opposite direction of the airflow, a piezoresonator configured in accordance with an embodiment of the present invention.
Figure 8C:
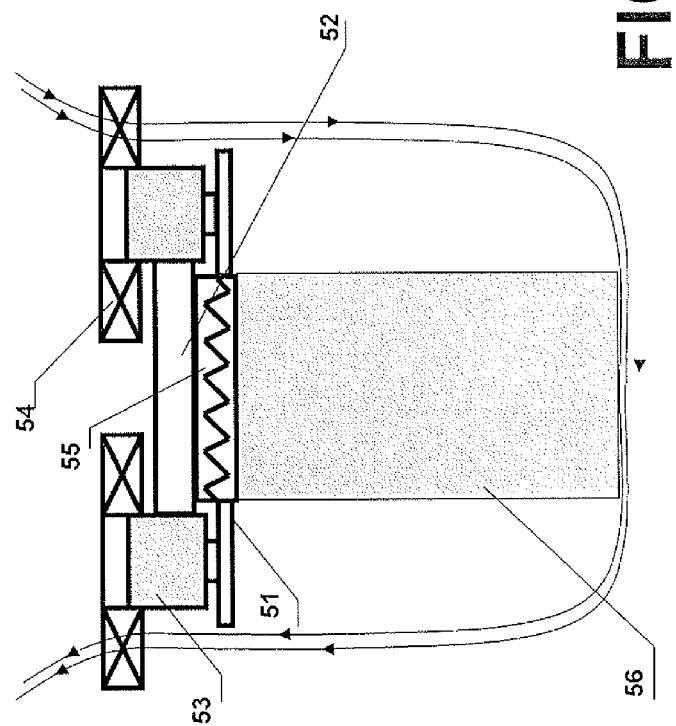

FIG. 8A shows a rotary pump 800 using a single fan and a piezoresonator configured in accordance with an embodiment of the present invention. FIGS. 8B and 8C show top and side views, respectively, of a rotary pump 850 with two fans having opposite directions of rotation, which provides opposite direction of the airflow, a piezoresonator configured in accordance with an embodiment of the present invention. The design of both pumps 800 and 850 includes: a base 51, a piezoresonator 52, rotor(s) with bearings 53, a fan 54, a spring 55, and a fuel cell element 56.

The rotary pumps 800 and 850 works as follows. When the piezoresonator 62 is electrically excited, its ends vibrate following an elliptical locus of movement, with the plane of this movement being parallel to the major plane of the piezoresonator 62. The elliptical path of the vibrations results from the combination of the deformations of the piezoresonator 62, stimulated by the electrical excitation of the piezoresonator 62. The end(s) of the piezoresonator 62 are held under the pressure of the spring 55 against the rotor(s) 53, so that the elliptical movement of the ends of the piezoresonator 52 transmits, via friction at the piezoresonator/rotor(s) contact area(s), rotation of the rotor(s) 53, which in turn causes the fan(s) 54 to rotate. The air from the fan(s) 54 is directed to the fuel cell element 56 to provide the oxygen for its operation.

If the cross-sectional area of the rotating fan(s) 54 is S=1 cm$^2$, and the coefficient for conversion of the linear movement at the end(s) of the piezoresonator 52 to rotary movement of the fan(s) 54 is K=0.4 cm/rev, the required speed of rotation n of the fan(s) 54 to ensure an airflow of Q=200 cm$^3$/min is determined by the expression:

$$n = Q/(K*S) = 200/(0.4 \times 1) = 500 \text{ rev/min}. \tag{6}$$

The advantages of this design are numerous. For example, such pumps can be configured in a very thin, flat and compact package that is amenable to assembly as an integral part of, or attachment to, the wall of the fuel cell enclosure. If the thickness of the piezoresonator 52 is less than 2 mm, and the rotary pump 600 would occupy a space in the order of 2-4 cm$^3$ enabling it to be fitted fit into a square area of side 25 mm. The two-fan design, shown in FIGS. 8B and 8C, provides an increased airflow and greater efficiency in the supply of air to the fuel cell. This design is intrinsically energy efficient and depending on the quality of the rotor bearing could be practically noiseless.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A piezoelectric device comprising:
    a piezoresonator body having opposing first and second surfaces and opposing third and fourth surfaces, said first and said second surfaces being substantially parallel to first and second longitudinal axes of said piezoresonator body, said third and said fourth surfaces being substantially parallel to said first longitudinal axis and substantially perpendicular to said second longitudinal axis, and said first and said second longitudinal axes being substantially perpendicular to each other;
    at least one common electrode disposed on said second surface;
    a plurality of electrodes disposed on said first surface, said plurality of electrodes comprising one or more pairs of excitation electrodes, each of said pairs of excitation electrodes comprising a first electrode and a second electrode positioned along a first direction along said first longitudinal axis; and
    one or more contact elements disposed on at least one of said third and said fourth surfaces at one or more contact locations, each of said contact locations at least partially aligned between said first and said second electrodes of one of said pairs of excitation electrodes;
    wherein said piezoelectric body has a first order natural resonance frequency ($v_1$) for a first standing longitudinal wave in a direction of said second longitudinal axis, an even order natural resonance frequency ($v_2$) for a second standing longitudinal wave in a direction of said first longitudinal axis, and wherein:

$$0\% < \frac{v_1 - v_2}{(v_1 + v_2)/2} * 100\% \le 20\%.$$

2. The piezoelectric device of claim 1, wherein said piezoelectric body has a length (L) along said first longitudinal axis, a width (B) along said second longitudinal axis, and wherein B =C/($2v_1$) and L=(nC)/($2v_2$), where C is acoustic wave velocity in the piezoresonator body, n=2k, and k is an integer >1.

3. The piezoelectric device of claim 2, wherein a first of each pair of said excitation electrodes are located in first electrode areas along L between 2i(L/n) and (2i+1)(L/n), and wherein a second of each pair of excitation electrodes are located in second electrode areas along L between (2i+1)(L/n) and (2i+2)(L/n), where i is an integer and (n−2)/2>i>0.

4. The piezoelectric device of claim 3, wherein said contact locations for said plurality of contact elements are defined by (2i+1)(L/n).

5. The piezoelectric device of claim 4, wherein n=2.

6. The piezoelectric device of claim 4, wherein n=4.

7. The piezoelectric device of claim 4, wherein n=6.

8. The piezoelectric device of claim 1, further comprising an alternating voltage source, said alternating voltage source configured for applying an alternating voltage to said common electrode and one of said first and said electrodes in each of said pairs of excitation electrodes to cause a nano-elliptical motion of at least a portion of said contact elements, said nano-elliptical motion substantially parallel to said first and said second surfaces, wherein said nano-elliptical motion of said portion of said contact elements disposed on said third surface is in a first elliptical path, wherein said nano-elliptical motion of said portion of said contact elements disposed on said fourth surface is in a second elliptical path opposite to said first elliptical path.

9. The piezoelectric device of claim 8, wherein a frequency ($v_3$) of said alternating voltage source is between $v_1$ and $v_2$.

10. The piezoelectric device of claim 8, further comprising at least one upper guide disposed above said upper surface and at least one lower guide disposed below said lower surface, said upper and said lower guides positioned to physically contact said contact elements during a portion of said nano-elliptical motion, said upper and said lower guides resiliently biased against said contact elements during said physical contact.

11. The piezoelectric device of claim 10, further comprising a stage, and wherein one of said piezoresonator body and said upper and lower guides has a fixed position with respect to said stage.

12. The piezoelectric device of claim 1, wherein said piezoresonator body is substantially cuboid.

13. The piezoelectric device of claim 1, wherein said piezoresonator body and said plurality of contact elements are integrally formed.

14. A system comprising a piezoelectric motor, said piezoelectric motor comprising:
    a piezoresonator body having opposing upper and lower surfaces and opposing front and back surfaces, said front and said back surfaces being parallel to a first and second longitudinal axes of said piezoresonator body, said first and said second longitudinal axes being perpendicular to each other, and said upper and said lower surfaces being parallel to said first longitudinal axis and perpendicular to said second longitudinal axis;

at least one common electrode disposed on said back surface;

a plurality of electrodes disposed on said front surface along said first longitudinal axis, said plurality of electrodes comprising one or more pairs of excitation electrodes; and a plurality of contact elements disposed on said upper and said lower surfaces at contact locations along said first longitudinal axis, each of said plurality contact elements associated with one of said pairs of excitation electrodes;

wherein said piezoelectric body has a even order natural resonance frequency ($v_2$) for a standing longitudinal wave in a direction of said first longitudinal axis, a first order natural resonance frequency ($v_i$) for a standing longitudinal wave in a direction of said second longitudinal axis, and wherein:

$$0\% < \frac{v_1 - v_2}{(v_1 + v_2)/2} * 100\% \leq 20\%.$$

15. A piezoelectric device comprising:

a piezoresonator body having opposing first and second surfaces and opposing third and fourth surfaces, said first and said second surfaces being substantially parallel to first and second longitudinal axes of said piezoresonator body, said third and said fourth surfaces being substantially parallel to said first longitudinal axis and substantially perpendicular to said second longitudinal axis, and said first and said second longitudinal axes being substantially perpendicular to each other;

at least one common electrode disposed on said back surface of the piezoresonator;

a plurality of electrodes disposed on said first surface, said plurality of electrodes comprising one or more pairs of excitation electrodes, each of said pairs of excitation electrodes comprising a first electrode and a second electrode positioned along a first direction along said first longitudinal axis; and one or more contact elements disposed on at least one of said third and said fourth surfaces at one or more contact locations, each of said contact locations at least partially aligned between said first and said second electrodes of one of said pairs of excitation electrodes;

at least one driven element in friction contact with said plurality of contact elements; and an excitation source connected to the one common electrode and to said pairs of excitation electrodes;

wherein said piezoelectric body has a first order natural resonance frequency ($v_i$) for a first standing longitudinal wave in a direction of said second longitudinal axis and a even order natural resonance frequency ($v_2$) for a second standing longitudinal wave in a direction of said first longitudinal axis, wherein:

$$0\% < \frac{v_1 - v_2}{(v_1 + v_2)/2} * 100\% \leq 20\%,$$

and wherein said excitation source is configured for applying an alternating voltage to said common electrode and one of said first and said second electrodes of each of said pairs of excitation electrodes to simultaneously generate said first standing longitudinal wave and said second standing longitudinal wave in said piezoelectric body.

16. The piezoelectric device of claim 15, wherein said piezoelectric body has a length (L) along said second longitudinal axis, a width (B) along said first longitudinal axis, and wherein B=C/(2$v_1$) and L=(nC)/(2$v_2$), where C is acoustic wave velocity in the piezoresonator body, n=2k, and k is an integer >1.

17. The piezoelectric device of claim 16, wherein a first of each pair of said excitation electrodes is located in the first electrode areas along L between 2i(L/n) and (2i +1)(L/n), and wherein a second of each pair of excitation electrodes are located in the second electrode areas along L between (2i+1)(L/n) and (2i+2)(L/n), where i is an integer and (n−2)/2>i >0.

18. The piezoelectric device of claim 17, wherein said contact locations for said plurality of contact elements are defined by (2i+1)(L/n).

19. The piezoelectric device of claim 16, wherein n=2, 4, or 6.

20. The piezoelectric device of claim 15, wherein a frequency ($v_3$) of said alternating voltage source is between $v_1$ and $v_2$.

21. The piezoelectric device of claim 15, wherein a shape of said piezoresonator body is one of a substantially cuboid shape.

22. The piezoelectric device of claim 15, wherein said friction contact between said driven element and said plurality of contact elements comprises a direct physical contact between said driven element and said plurality of contact elements.

23. The piezoelectric device of claim 15, wherein said piezoresonator body and said plurality of contact elements are integrally formed.

* * * * *